United States Patent
Xiang et al.

(10) Patent No.: US 7,015,078 B1
(45) Date of Patent: Mar. 21, 2006

(54) SILICON ON INSULATOR SUBSTRATE HAVING IMPROVED THERMAL CONDUCTIVITY AND METHOD OF ITS FORMATION

(75) Inventors: Qi Xiang, San Jose, CA (US); Jung-Suk Goo, Stanford, CA (US); James Pan, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 5 days.

(21) Appl. No.: 10/658,668

(22) Filed: Sep. 9, 2003

(51) Int. Cl.
*H01L 21/00* (2006.01)

(52) U.S. Cl. .................. 438/149; 438/479; 438/155
(58) Field of Classification Search .............. 438/3, 438/283, 151, 518, 406, 239, 149, 155, 571, 438/753, 479, 435; 257/705, 347, 510, 704
See application file for complete search history.

(56) References Cited

U.S. PATENT DOCUMENTS

| | | | |
|---|---|---|---|
| 4,882,252 A * | 11/1989 | Kawamura et al. ......... 430/57.6 |
| 5,637,353 A * | 6/1997 | Kimock et al. ......... 427/255.34 |
| 6,130,102 A * | 10/2000 | White et al. .................... 438/3 |
| 6,274,424 B1 * | 8/2001 | White et al. ................. 438/239 |
| 6,413,802 B1 * | 7/2002 | Hu et al. ..................... 438/151 |
| 6,508,948 B1 * | 1/2003 | Felker et al. ................. 216/63 |
| 6,562,703 B1 * | 5/2003 | Maa et al. ................... 438/518 |
| 6,613,643 B1 * | 9/2003 | Krishnan et al. ........... 438/406 |
| 6,635,909 B1 * | 10/2003 | Clark et al. ................. 257/192 |
| 6,806,532 B1 * | 10/2004 | Kobayashi .................. 257/324 |

* cited by examiner

*Primary Examiner*—Hoai Pham
*Assistant Examiner*—(Vikki) Hoa B. Trinh
(74) *Attorney, Agent, or Firm*—Foley & Lardner LLP

(57) ABSTRACT

A silicon on insulator (SOI) substrate includes a layer of silicon carbide beneath an insulating layer on which semiconductor devices are formed. The silicon carbide layer has a high thermal conductivity and provides beneficial dissipation of thermal energy generated by the devices. The SOI substrate may be formed by a bonding method. SOI MOSFET devices using the SOI substrate are also disclosed.

15 Claims, 12 Drawing Sheets

US 7,015,078 B1

SILICON ON INSULATOR SUBSTRATE HAVING IMPROVED THERMAL CONDUCTIVITY AND METHOD OF ITS FORMATION

BACKGROUND OF THE INVENTION

1. Field of the Invention

The invention pertains to semiconductor devices, and more particularly to vertical double gate MOSFETs, also known as FinFETs.

2. Related Technology

Metal oxide semiconductor field effect transistors (MOSFETs) are the primary component of most semiconductor devices. The conventional MOSFET is comprised of heavily doped source and drain regions that are formed in a semiconductor substrate. The portion of the substrate in which the source and drain regions are formed is lightly doped with a dopant having a conductivity opposite to that of the source and drain regions. As a result, depletion regions form at the junctions of the source and drain regions with the surrounding substrate material, providing electrical isolation of the MOSFET from the substrate and other devices formed in it.

As channel lengths are reduced to less than 100 nm, MOSFETs formed in semiconductor substrates experience performance degrading phenomena such as the short channel effect. The short channel effect degrades the ability of the MOSFET gate to control conductivity in the MOSFET channel region due to interactions of the source and drain regions that occur as a result of the semiconductor substrate materials that surround the source and drain regions.

An alternative to the formation of devices in semiconductor substrates is silicon on insulator (SOI) construction. In SOI construction, the semiconductor material in which the MOSFET is formed overlies a dielectric layer that electrically isolates each device. SOI devices have a number of advantages over devices formed in semiconductor substrates, such as better isolation between devices, reduced leakage current, reduced latch-up between CMOS elements, reduced chip capacitance, and reduction or elimination of short channel coupling between source and drain regions.

One type of MOSFET structure that is formed using SOI construction is conventionally known as a vertical double-gate MOSFET, or a FinFET. As shown in FIG. 1, the FinFET is constructed from a monolithic silicon body that includes a source region 12, a drain region 14 and a fin-shaped channel region 16. The monolithic silicon body is patterned from a silicon layer provided on a dielectric substrate 18. After patterning the silicon body, a gate oxide (not shown) is grown or deposited over the silicon body, and then a conductive gate 20 is patterned so as to surround the channel region 16. The gate 20 is patterned from a conformal layer of a conductive material such as polysilicon. FIG. 2 shows a view of a cross-section of the gate and channel region of the FinFET of FIG. 1. As seen in FIG. 2, the gate 20 and channel region 16 are separated by the gate oxide 22, and the gate 20 surrounds the channel region 16 on both of its sidewalls, thus serving as a double gate that imparts gate voltage to both sides of the channel region 16. The channel width of a FinFET is therefore at least double the height of the channel region 16, enabling a high driving current compared to MOSFETs of comparable size formed in semiconductor substrates. The aspect ratio of the cross section of the channel region 16 is therefore preferably as high as possible so as to form a tall, narrow channel region that provides a maximum effective channel width while keeping the lateral size of the device small.

The substrate from which the conventional SOI device is patterned may be formed in a variety of manners. FIGS. 3a, 3b and 3c show structures formed using implanted oxygen to form a buried oxide (BOX) layer in a silicon substrate. As shown in FIG. 3a, a silicon substrate 24 is provided. The silicon substrate 24 is implanted with oxygen 26 at an energy sufficient to form an oxygenated region 28 at such a depth as to leave a required thickness of silicon above the oxygenated region.

FIG. 3b shows the structure of FIG. 3a after annealing of the silicon substrate 24 to form a buried silicon oxide layer 30 within the substrate. Annealing is typically performed at approximately 1350 degrees C. for approximately four hours. FIG. 3c shows the structure of FIG. 3b after patterning a silicon FinFET body 32 (shown in cross section at the channel region) from the silicon layer that overlies the oxide layer 30.

FIGS. 4a–4d shows structures formed in accordance with a bonding method for forming an SOI substrate. FIG. 4a shows a planarized silicon substrate 34. The substrate 34 is implanted with hydrogen 36 to form a hydrogen rich region 38 within the silicon material. The hydrogen 36 is implanted with an energy such that the amount of silicon remaining above the hydrogen rich region exceeds the thickness of the silicon layer to be formed on the SOI substrate. In some applications a different material such as oxygen may be implanted.

FIG. 4b shows the silicon substrate 34 of FIG. 4a after being cleaned, stripped of oxide in a diluted HF solution, rinsed in deionized water to form an active native oxide on its surface, and then inverted and bonded to a planarized oxide layer 42 formed on a semiconductor layer 44 of second substrate 40. Bonding is generally performed in two stages. In a first stage, the substrates are heated to approximately 600 degrees C. in an inert environment for approximately three hours. As shown in FIG. 4c, the heating of the first stage causes bonding of the silicon 46 of the silicon substrate 34 to the dielectric layer 42 of the substrate 40 due to Van der Waals forces. The heating of the first stage also causes the silicon substrate 34 to fracture along the hydrogen rich region 38, thus leaving a new substrate comprising a silicon layer 46 bonded to an oxide layer 42 and having a residual hydrogen rich region 38 at its upper surface. In a second stage of the bonding process, the bonded structure is heated to approximately 1050–1200 degrees C. for 30 minutes to two hours to strengthen the bond between the dielectric layer 42 and the silicon layer 46. To facilitate bonding, the substrates should be planarized to a homogeneity of 0.5 microns or less. The resulting substrate is then planarized and cleaned, leaving a silicon SOI substrate as shown in FIG. 4d.

One option for increasing the performance of MOSFETs is to enhance the carrier mobility of the MOSFET semiconductor material so as to reduce resistance and power consumption and to increase drive current, frequency response and operating speed. A method of enhancing carrier mobility that has become a focus of attention is the use of silicon material to which a tensile strain is applied. "Strained" silicon may be formed by growing a layer of silicon on a silicon germanium substrate. The silicon germanium lattice is more widely spaced on average than a pure silicon lattice due to the presence of the larger germanium atoms in the lattice. Because the atoms of the silicon lattice align with the more widely spaced silicon germanium lattice, a tensile strain is created in the silicon layer. The silicon atoms are essentially pulled apart from one another. The amount of tensile strain applied to the silicon lattice increases with the proportion of germanium in the silicon germanium lattice.

The tensile strain applied to the silicon lattice increases carrier mobility. Relaxed silicon has six equal valence bands. The application of tensile strain to the silicon lattice causes four of the valence bands to increase in energy and two of the valence bands to decrease in energy. As a result of quantum effects, electrons effectively weigh 30 percent less when passing through the lower energy bands. Thus the lower energy bands offer less resistance to electron flow. In addition, electrons encounter less vibrational energy from the nucleus of the silicon atom, which causes them to scatter at a rate of 500 to 1000 times less than in relaxed silicon. As a result, carrier mobility is dramatically increased in strained silicon as compared to relaxed silicon, offering a potential increase in mobility of 80% or more for electrons and 20% or more for holes. The increase in mobility has been found to persist for current fields of up to 1.5 megavolts/centimeter. These factors are believed to enable a device speed increase of 35% without further reduction of device size, or a 25% reduction in power consumption without a reduction in performance.

Strained silicon may be used in both silicon substrate and SOI devices. In strained silicon SOI devices, a silicon germanium layer is provided over an insulating substrate, either by the BOX method or by the bonding method, and the silicon germanium is then used as a base upon which strained silicon is grown. A cross-sectional view of a channel region of a strained silicon FinFET structure is shown in FIG. 5. As seen in FIG. 5, the structure comprises a silicon germanium channel region 50 on which is grown an epitaxial layer of strained silicon 52. A gate insulating layer 54 is formed over the strained silicon layer 52, and a double gate structure 56 is formed around the channel portion 50. Thus the structure shown in FIG. 5 forms part of a FinFET that exhibits enhanced carrier mobility as the result of the strained silicon layer provided at the surface of the channel region as well as the source and drain regions.

One detrimental property of SOI construction is that the thermal conductivity of the insulating substrate is significantly less than that of silicon. Heat generated by a MOSFET formed in a silicon substrate is conducted away from the active region through the silicon substrate, which has a relatively good thermal conductivity of 1.5° W/cm-C. In contrast, a silicon oxide substrate has a very poor thermal conductivity of 0.014° W/cm-C. Further, in strained silicon applications, the thermal conductivity of silicon germanium is approximately 0.1° W/cm-C. for a silicon germanium layer having a 20% germanium content, which contributes further to heat dissipation problems. As a result, insufficient dissipation of thermal energy can occur in SOI devices, leading to significant self-heating. Self-heating is known to degrade the I-V characteristics of the MOSFET, such that source-drain current Ids is reduced for a given source-drain voltage Vds.

Therefore the advantages of MOSFETs formed by SOI construction are partly offset by the disadvantages resulting from the poor thermal conductivity of SOI substrates.

SUMMARY OF THE INVENTION

Embodiments of the invention provide an improved SOI MOSFET by employing an SOI substrate that includes a layer of silicon carbide. Silicon carbide (SiC) is an electrically insulating material having a high thermal conductivity of 93.5° W/cm-C. The SOI substrate is comprised of a dielectric layer such as silicon oxide formed over a layer of silicon carbide. The silicon carbide dissipates thermal energy through the substrate, thus reducing self-heating of the SOI MOSFETs.

In accordance with one embodiment of the invention, a substrate for silicon on insulator devices is comprised of a silicon carbide layer having a dielectric layer formed thereon.

In accordance with another embodiment of the invention, a silicon on insulator device comprises a SOI substrate including a silicon carbide layer having a dielectric layer formed thereon, and at least one MOSFET formed on the dielectric layer.

In accordance with further embodiments of the invention, a silicon on insulator substrate is formed by forming a first dielectric layer on a silicon wafer, forming a layer of silicon carbide over the first dielectric layer, and then forming a second dielectric layer on the silicon carbide layer.

In accordance with another embodiment of the invention, a silicon on insulator device is formed by providing a SOI substrate comprised of a silicon carbide layer having formed thereon a dielectric layer, and having a layer of a semiconductor material formed on the dielectric layer. A FinFET body is patterned from the semiconductor material, a gate insulator is formed around at least the channel region of the FinFET body, and a gate is then formed around the channel region, the gate being separated from the channel region by the gate insulator.

In accordance with another embodiment of the invention, a silicon on insulator device is formed by providing an SOI substrate comprised of a silicon carbide layer having formed thereon a dielectric layer and having a layer of a semiconductor material formed on the dielectric layer. Shallow trench isolations are formed to extend through the semiconductor material to the dielectric layer to define an active region of the substrate, and then a MOSFET is formed in the active region.

DESCRIPTION OF THE DRAWINGS

Embodiments of the invention are described in conjunction with the following drawings, in which.

DETAILED DESCRIPTION OF PREFERRED EMBODIMENTS

Figure 1:
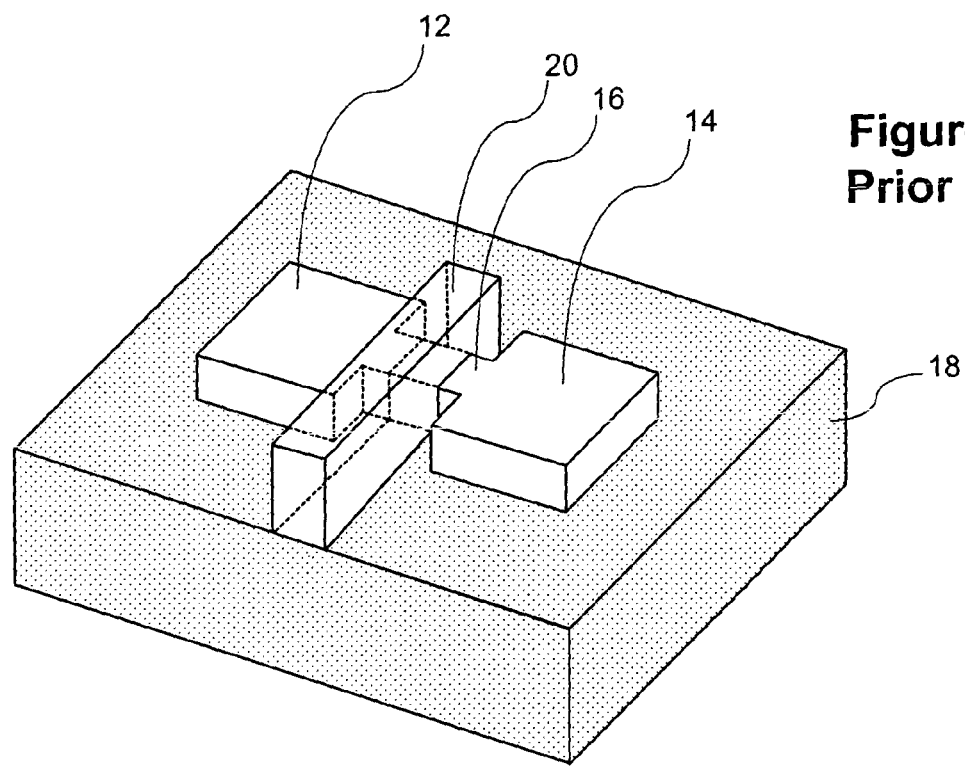
FIG. 1 shows the structure of a conventional SOI FinFET.
Figure 2:
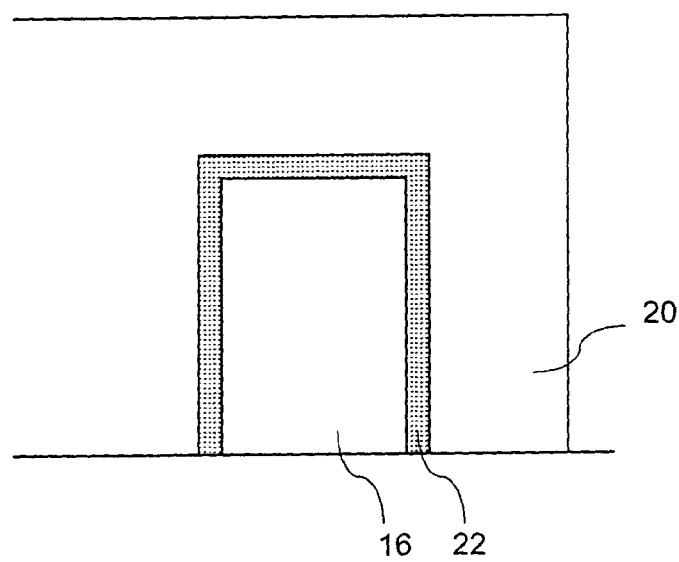
FIG. 2 shows a cross-section of the channel region of the FinFET of FIG. 1.
Figure 3A:
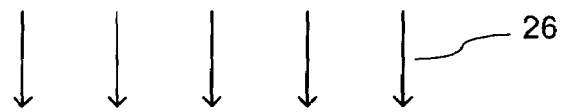
FIGS. 3a, 3b and 3c show the formation of a buried oxide (BOX) SOI substrate.
Figure 3A:
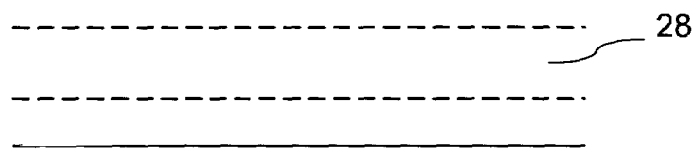
Figure 3B:
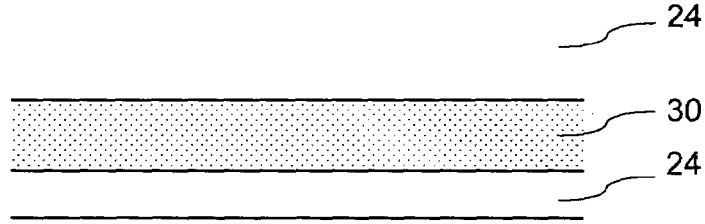
Figure 3C:
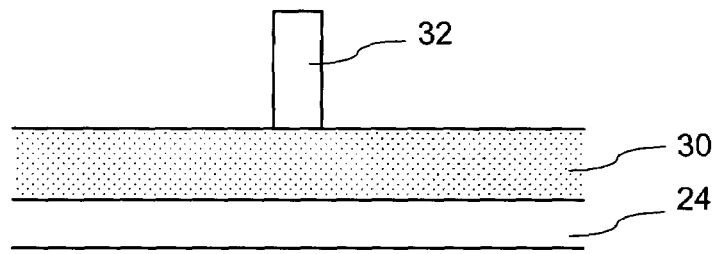
Figure 4A:
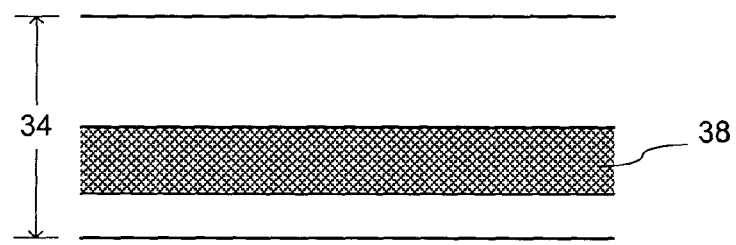
FIGS. 4a, 4b, 4c and 4d show the formation of a SOI substrate by a bonding method.
Figure 4B:
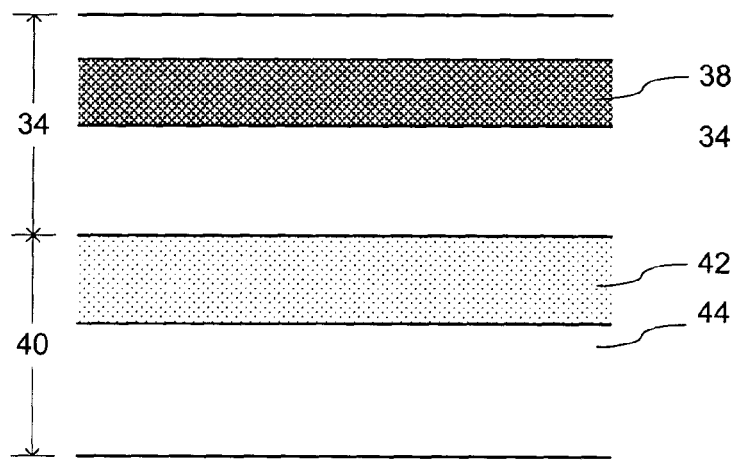
Figure 4C:
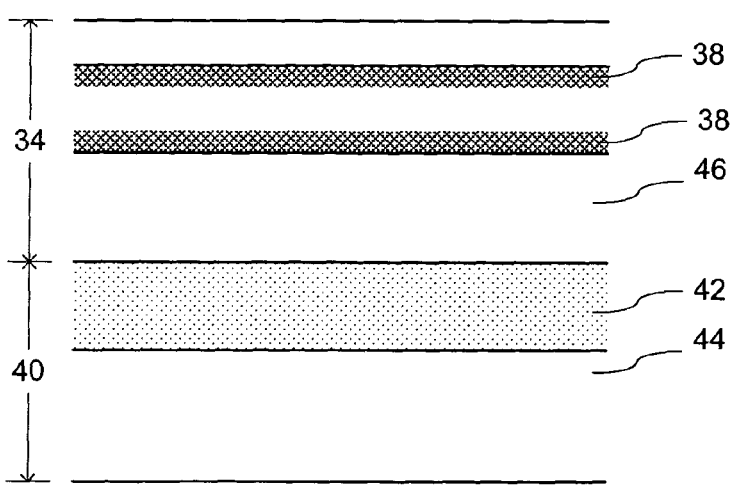
Figure 4D:
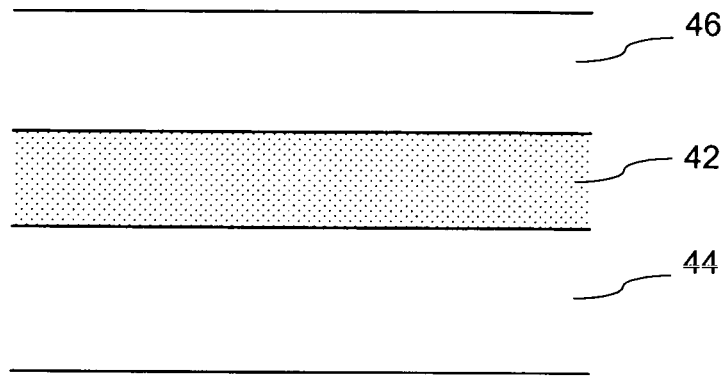
Figure 5:
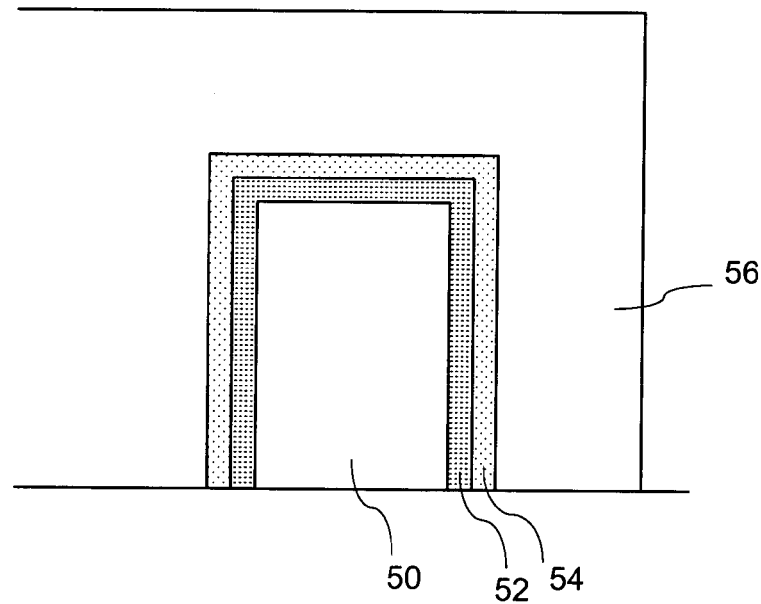
FIG. 5 shows a cross-section of the channel region of a strained silicon FinFET.
Figure 6A:
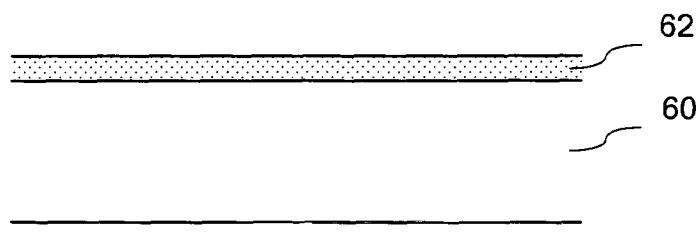
FIGS. 6a, 6b, 6c, 6d, 6e, 6f, 6g, 6h, 6i and 6j show structures formed during fabrication of an SOI device in accordance with a preferred embodiment of the invention.

FIGS. 6a–6j show structures formed during fabrication of an SOI MOSFET using a SOI substrate in accordance with a preferred embodiment of the invention. FIG. 6a shows a substrate comprising a semiconductor layer 60 and a dielectric layer 62. The semiconductor layer 60 is typically a silicon wafer. The dielectric layer 62 is typically an oxide of the semiconductor material and may be formed by thermal oxidation or may be deposited on the semiconductor layer 60. The dielectric layer preferably has a thickness in the range of about 100–200 angstroms.

Figure 6B:
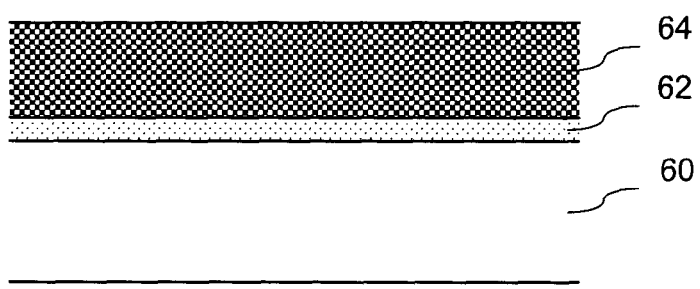

FIG. 6b shows the structure of FIG. 6a after formation of a silicon carbide layer 64 on the oxide layer 62. The silicon carbide layer 64 typically has a thickness in the range of 500–2000 angstroms. The silicon carbide material may be formed by plasma vapor deposition (PVD) using a gas mixture comprising a silicon source, a carbon source, and an inert gas. The silicon source and the carbon source may be provided together by one or more organosilane compounds having the general formula $Si_xC_yH_z$, where x has a range from 1 to 2, y has a range from 1 to 6, and z has a range from 4 to 18. For example, methylsilane ($SiCH_6$), dimethylsilane ($SiC_2H_8$), trimethylsilane ($SiC_3H_{10}$), tetramethylsilane ($SiC_4H_{12}$), and diethylsilane ($SiC_4H_{12}$), among others may be used as the organosilane compound. Alternatively, silane ($SiH_4$) or disilane ($Si_2H_6$) may be used as the silicon source and methane ($CH_4$) may be used as the carbon source. Helium (He), argon (Ar), nitrogen ($N_2$), or combinations thereof, among others, may be used as the inert gas. In general, the silicon carbide material is deposited using a wafer temperature of about 150 degrees C. to about 450 degrees C., a chamber pressure of about 1 torr to about 15 torr, a silicon source/carbon source flow rate of about 10 sccm to about 2000 sccm, an inert gas flow rate of less than about 1000 sccm, a plate spacing of about 300 mils to about 600 mils, and one or more RF powers of about 1 watt/cm$^2$ to about 500 watts/cm$^2$. These processing parameters provide a deposition rate of approximately 100–3000 angstroms/minute.

Figure 6C:
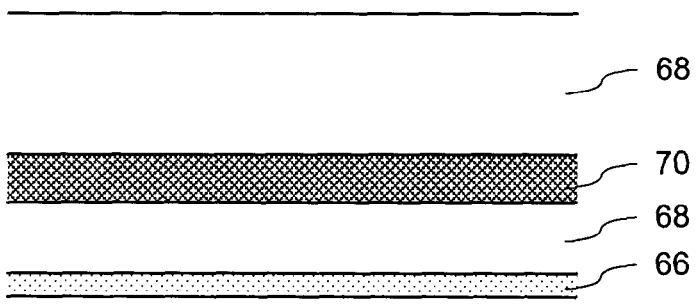

FIG. 6c shows a second semiconductor substrate having an oxide layer 66 formed on its surface and a hydrogen implanted region 70. The semiconductor substrate is preferably a silicon wafer (not shown) having a silicon germanium layer 68 grown thereon, with the hydrogen implanted region 70 being formed in the silicon germanium layer 68 and a surface of the silicon germanium layer 68 being oxidized to form a silicon oxide dielectric layer 66 on the silicon germanium layer 68. The silicon germanium layer 68 preferably has a composition $Si_{1-x}Ge_x$, where x is approximately 0.2, and is more generally in the range of 0.1 to 0.3. Silicon germanium may be grown, for example, by chemical vapor deposition using $Si_2H_6$ (disilane) and $GeH_4$ (germane) as source gases, with a substrate temperature of 600 to 900 degrees C., a $Si_2H_6$ partial pressure of 30 mPa, and a $GeH_4$ partial pressure of 60 mPa. $SiH_4$ (silane) may be used as a source of silicon in alternative processes. Growth of the silicon germanium material may be initiated using these ratios, or alternatively the partial pressure of $GeH_4$ may be gradually increased beginning from a lower pressure or zero pressure to form a gradient composition.

Figure 6D:
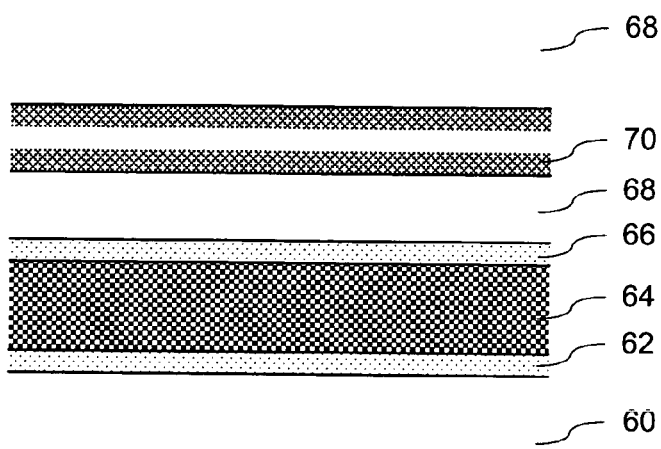

FIG. 6d shows the structures of FIGS. 6b and 6c after bonding of the dielectric layer 66 of the structure of FIG. 6c to the silicon carbide layer 64 of the structure of FIG. 6b. Bonding is performed after precise planarization of the adjoining faces of the dielectric layer 66 and the silicon carbide layer 64 to provide maximum surface contact for optimal bonding. Prior to bonding, oxide is stripped from the silicon carbide layer 64 in a diluted HF solution. The silicon carbide layer 64 is then rinsed in deionized water to form an active native oxide on its surface, and is then placed in contact with the dielectric layer 66. A first heat treatment is then performed to cause fracturing along the hydrogen implanted region and bonding between the dielectric layer 66 and the silicon carbide layer 64. The first heat treatment may be performed, for example, at a temperature of approximately 600 degrees C. in an inert atmosphere for three hours. A second heat treatment is then performed in an inert atmosphere at a temperature of approximately 1050–1200 degrees C. for 30 minutes to two hours to strengthen the bond between the dielectric layer 66 and the silicon carbide layer 64.

Figure 6E:
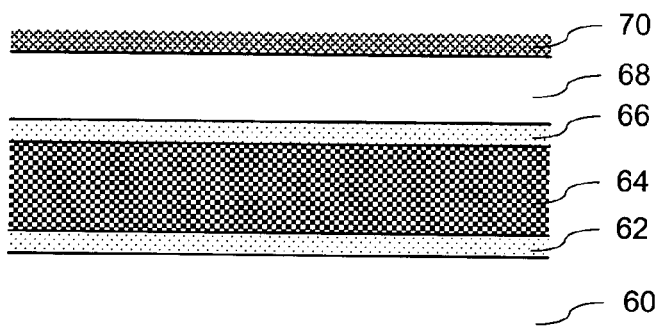
Figure 6F:
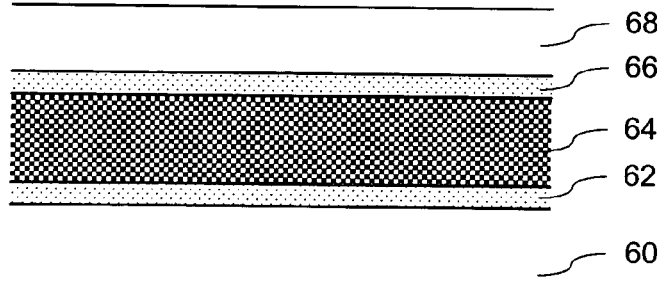

FIG. 6e shows the structure of FIG. 6d after completion of bonding and removal of the fractured portion of the upper substrate. FIG. 6f shows the structure of FIG. 6e after performing chemical mechanical polishing to remove residual hydrogen implanted material and smooth the upper surface of the silicon germanium layer 68. The resulting silicon germanium layer 68 preferably has a thickness in the range of 500–2000 angstroms, with thinner layers being preferably for formation of partially depleted MOSFETs.

Figure 6G:
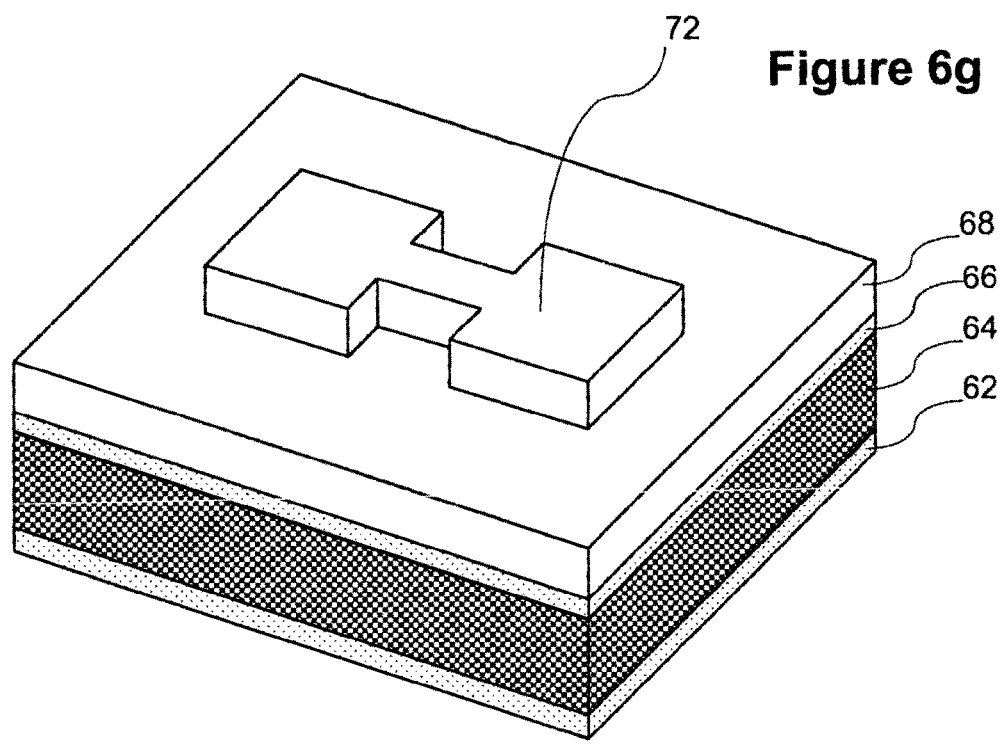

FIG. 6g shows a perspective view of a section of the structure of FIG. 6f after formation of a mask 72 on the silicon germanium layer 68. The semiconductor layer of the substrate that underlies the lower dielectric layer 62 is not shown in this view. The mask 72 is provided in the shape of a monolithic FinFET body to be patterned from the silicon germanium layer 68. The mask may comprise photoresist, and may also comprise hardmask layers and antireflective layers.

Figure 6H:
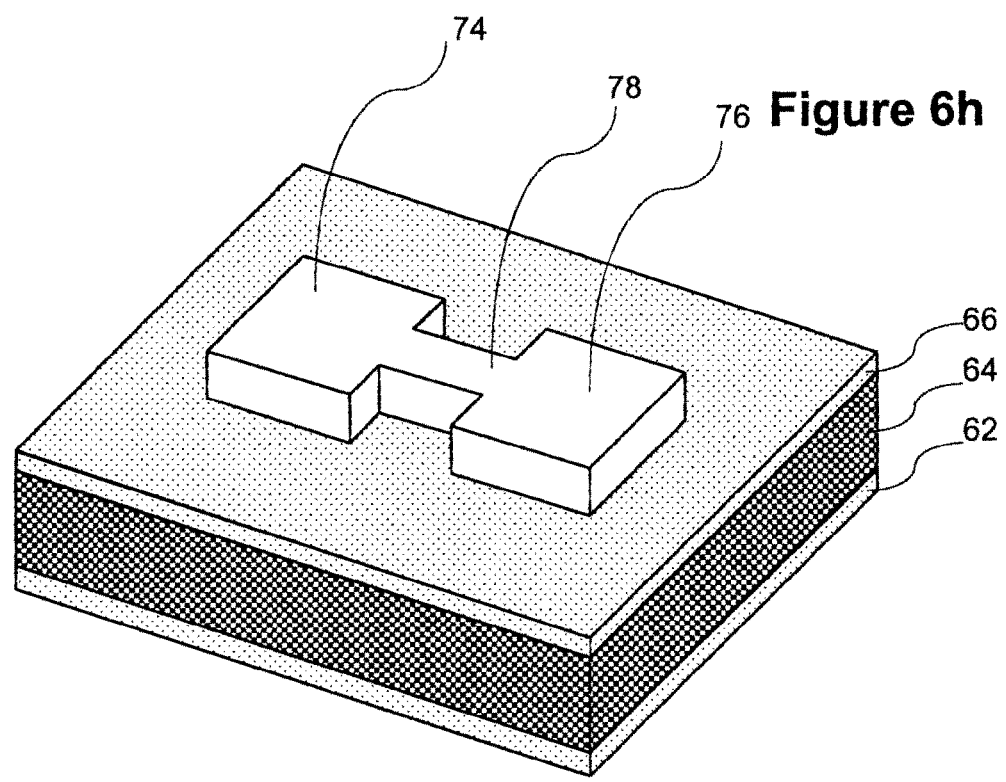

FIG. 6h shows the structure of FIG. 6g after patterning of the silicon germanium layer to form a monolithic FinFET body including source 74 and drain 76 regions and a channel region 78.

Figure 6I:
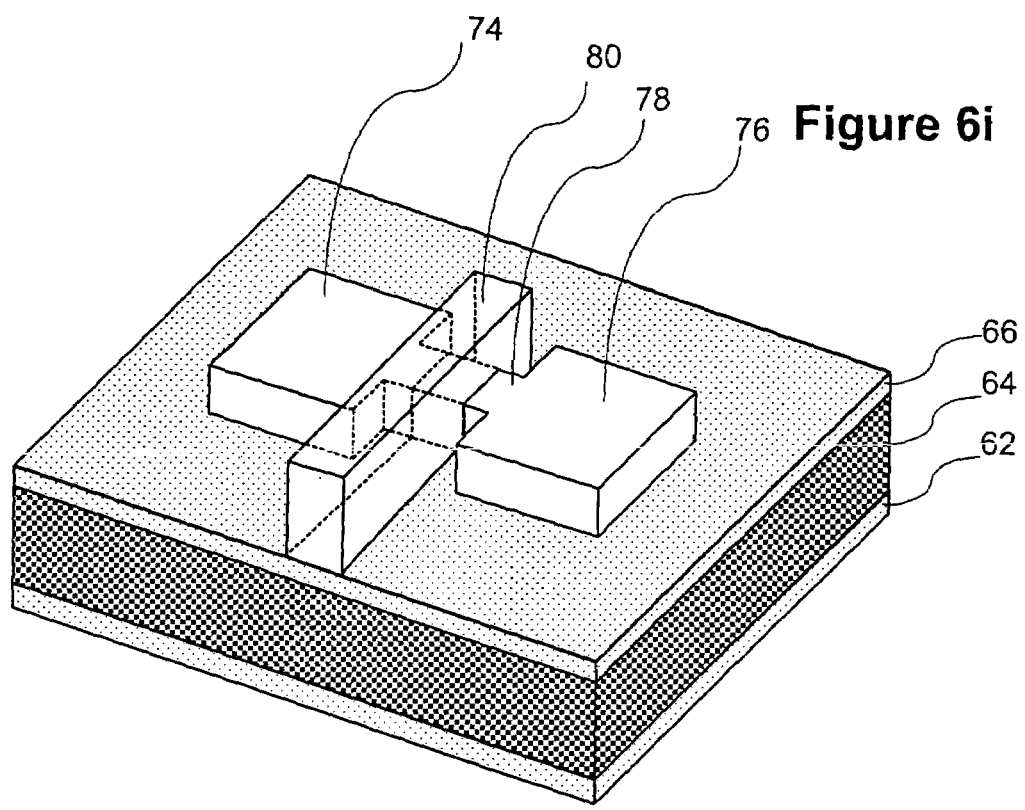

FIG. 6i shows the structure of FIG. 6h after selective growth of a layer of strained silicon (not shown) on the FinFET body, followed by formation of a gate insulating layer (not shown) on at least the channel region 78 of the FinFET body, and then followed by formation of a gate 80 surrounding the channel region 78 of the FinFET body. The strained silicon is preferably grown by chemical vapor deposition (CVD) using $Si_2H_6$ (disilane) as a source gas with a partial pressure of 30 mPa and a substrate temperature of approximately 600 to 900 degrees C. $SiH_4$ (silane) may also be used as a silicon source gas. The strained silicon layer is preferably grown to a thickness of at 200–300 angstroms. The maximum thickness of strained silicon that can be grown without misfit dislocations will depend on the percentage of germanium in the silicon germanium of the FinFET body. The gate insulating layer may be formed by thermal oxidation of the strained silicon layer of the FinFET body, or may be a conformal layer of silicon oxide deposited over the FinFET body and the dielectric layer 66. The material of the gate 80 is preferably doped polysilicon that is deposited as a conformal layer over the FinFET body and the dielectric layer 66 and then patterned.

Figure 6J:
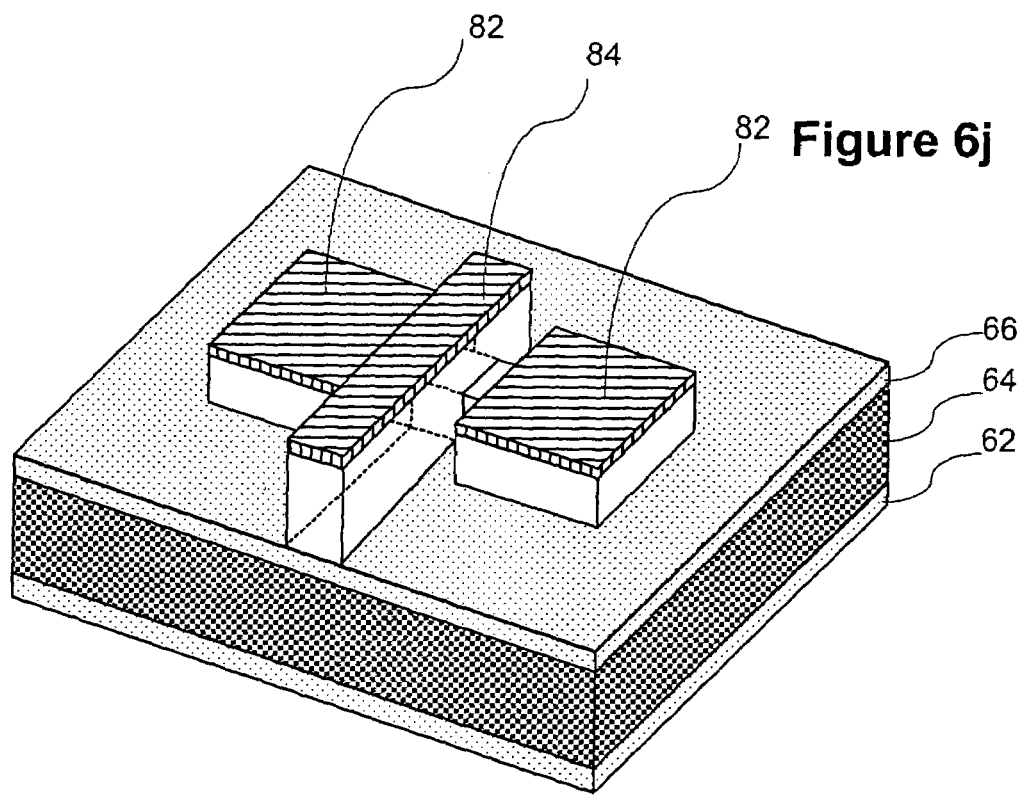

FIG. 6j shows the structure of FIG. 6i after formation of silicide contacts 82 on the source and drain regions and a silicide contact 84 on the gate. The silicide contacts 82, 84 are formed of a compound comprising a semiconductor material and a metal. Typically a metal such as cobalt (Co) is used, however other metals such as nickel (Ni) may also be employed. The silicide contacts are formed by depositing a thin conformal layer of the metal over the entire structure, and then annealing to promote silicide formation at the points of contact between the metal and underlying semiconductor materials, followed by stripping of residual metal. Formation of silicide contacts is typically preceded by a patterning step to remove oxides from portions of the gate and the source and drain regions where the silicides are to be formed.

A typical FinFET may include additional structural features not illustrated here. For example, spacers are typically formed around the gate to separate the gate from the source and drain regions of the FinFET body.

While the preferred embodiment employs a SOI substrate having a layer of silicon germanium from which FinFET bodies are patterned to form strained silicon MOSFETs, alternative embodiments may form an SOI substrate comprising a layer of silicon carbide, a dielectric layer, and a layer of silicon for forming conventional silicon FinFETs.

Figure 7:
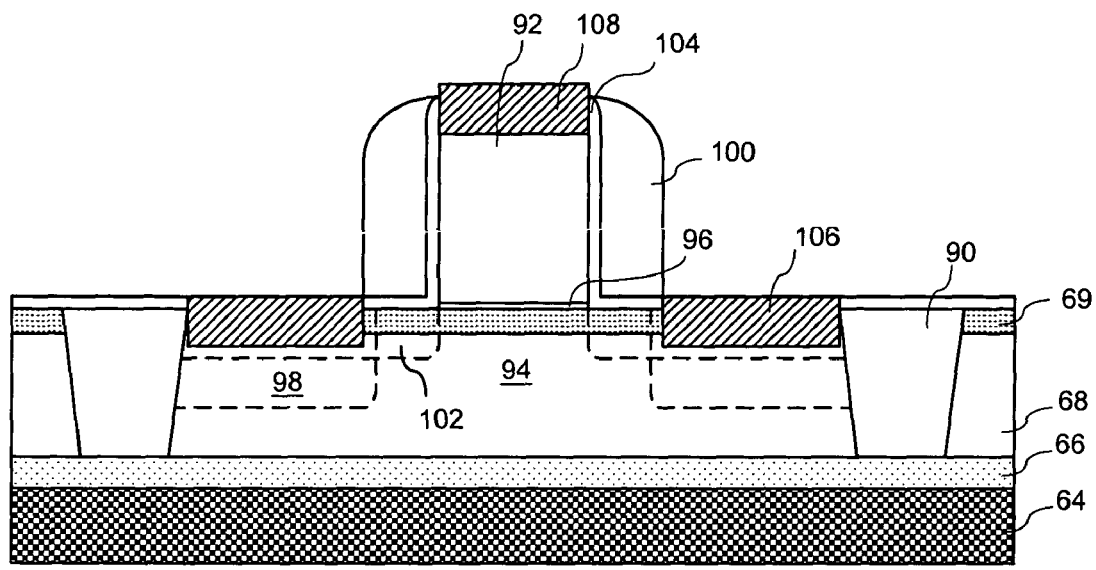
FIG. 7 shows a SOI MOSFET structure in accordance with an alternative embodiment.

FIG. 7 shows an alternative SOI strained silicon MOSFET using an SOI substrate formed in the manner of FIGS. 6a–6f. The MOSFET is formed on an SOI substrate that comprises a silicon germanium layer 68 provided on a dielectric layer 66 that overlies a silicon carbide layer 64 formed on a substrate (not shown). A layer of strained silicon 69 is grown on the silicon germanium layer 68. The MOSFET is formed in an active region defined by shallow trench isolations 90 that extend through the silicon germanium layer 68 to the underlying dielectric layer 66. The MOSFET is comprised of a gate 92 and a channel region 94 that are separated by a thin gate insulator 96 such as silicon oxide or silicon oxynitride. The gate 92 is typically patterned from a semiconductor material such as polysilicon. The source and drain of the MOSFET comprise deep source and drain regions 98 formed on opposing sides of the channel region 94. The deep source and drain regions 98 are formed by ion implantation subsequent to the formation of a spacer 100 around the gate 92. The spacer 100 serves as a mask during implantation to define the lateral positions of the deep source and drain regions 98 relative to the channel region 94.

The source and drain of the MOSFET further comprise shallow source and drain extensions 102. The use of shallow source and drain extensions 102 near the ends of the channel 94 helps to reduce short channel effects. The shallow source and drain extensions 102 are implanted after the formation of a protective layer 104 around the gate 92 and over the substrate, and prior to the formation of the spacer 100. The gate 92 and the protective layer 104 act as an implantation mask to define the lateral position of the shallow source and drain extensions 102 relative to the channel region 94. Diffusion during subsequent annealing causes the shallow source and drain extensions 102 to extend slightly beneath the gate 92.

Source and drain suicides 106 are formed on the deep source and drain regions 98 to provide ohmic contacts and reduce contact resistance. The suicides 106 are comprised of the substrate semiconductor material and a metal such as cobalt (Co) or nickel (Ni). The deep source and drain regions 98 are formed deeply enough to extend beyond the depth to which the source and drain silicides 106 are formed. The gate 92 likewise has a silicide 108 formed on its upper surface.

While the alternative embodiment of FIG. 7 pertains to a strained silicon SOI MOSFET, in further alternatives an SOI MOSFET of the type shown in FIG. 7 may be formed using an SOI substrate comprising a silicon layer provided over dielectric and silicon carbide layers.

A variety of embodiments may therefore be implemented in accordance with the invention. In general terms, an embodiment may encompass a substrate for silicon on insulator devices that is comprised of a silicon carbide layer having a dielectric layer formed thereon. An embodiment may also encompass a silicon on insulator device that comprises a SOI substrate including a silicon carbide layer having a dielectric layer formed thereon, and at least one metal oxide semiconductor field effect transistor (MOSFET) formed on the dielectric layer. The SOI substrate may comprise a silicon layer from which devices are formed, or a silicon germanium layer from which strained silicon devices are formed.

Figure 8:
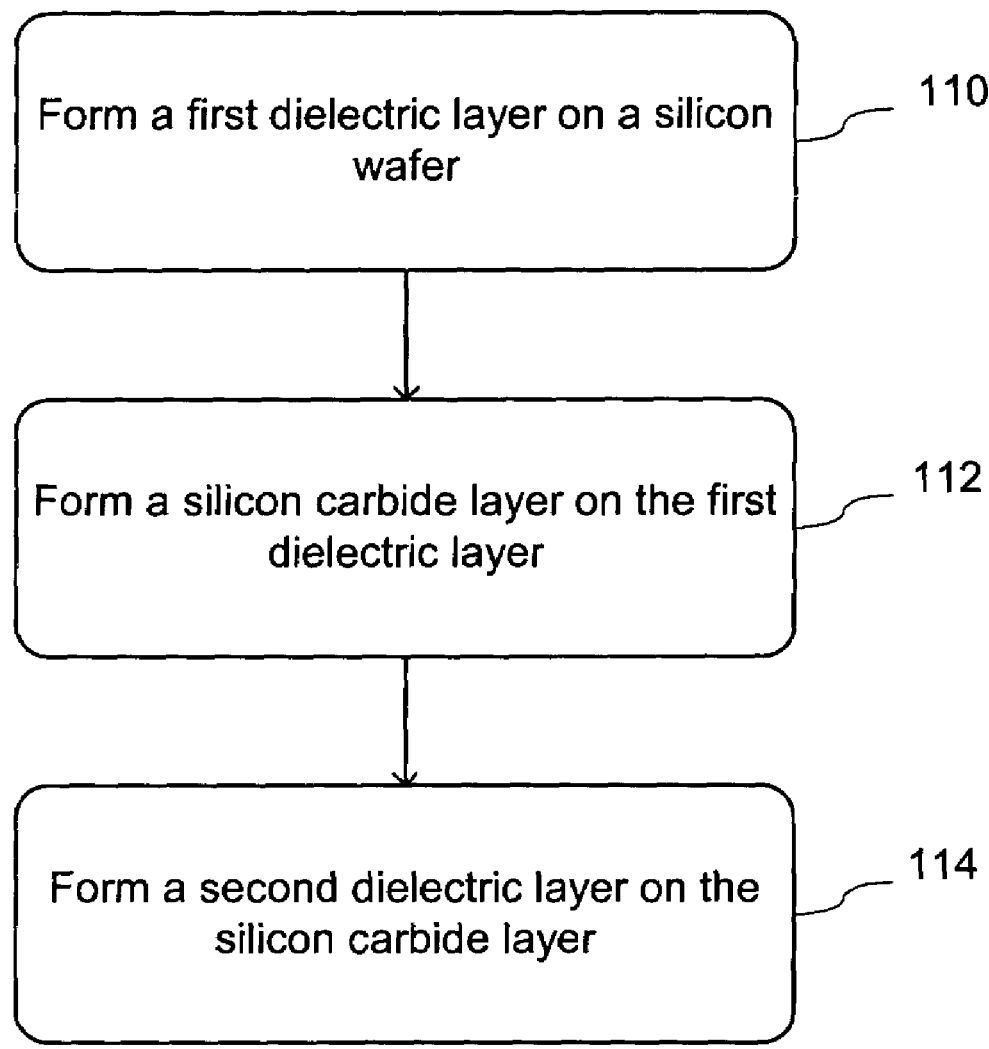
FIG. 8 shows a process flow for fabricating an SOI substrate.

FIG. 8 shows a process flow encompassing an embodiment of the invention for producing an SOI substrate as shown in FIG. 6d. Initially a first dielectric layer is formed on a silicon wafer (110). A layer of silicon carbide is then formed over the first dielectric layer (112), and a second dielectric layer is then formed on the silicon carbide layer (114), such as by bonding.

Figure 9:
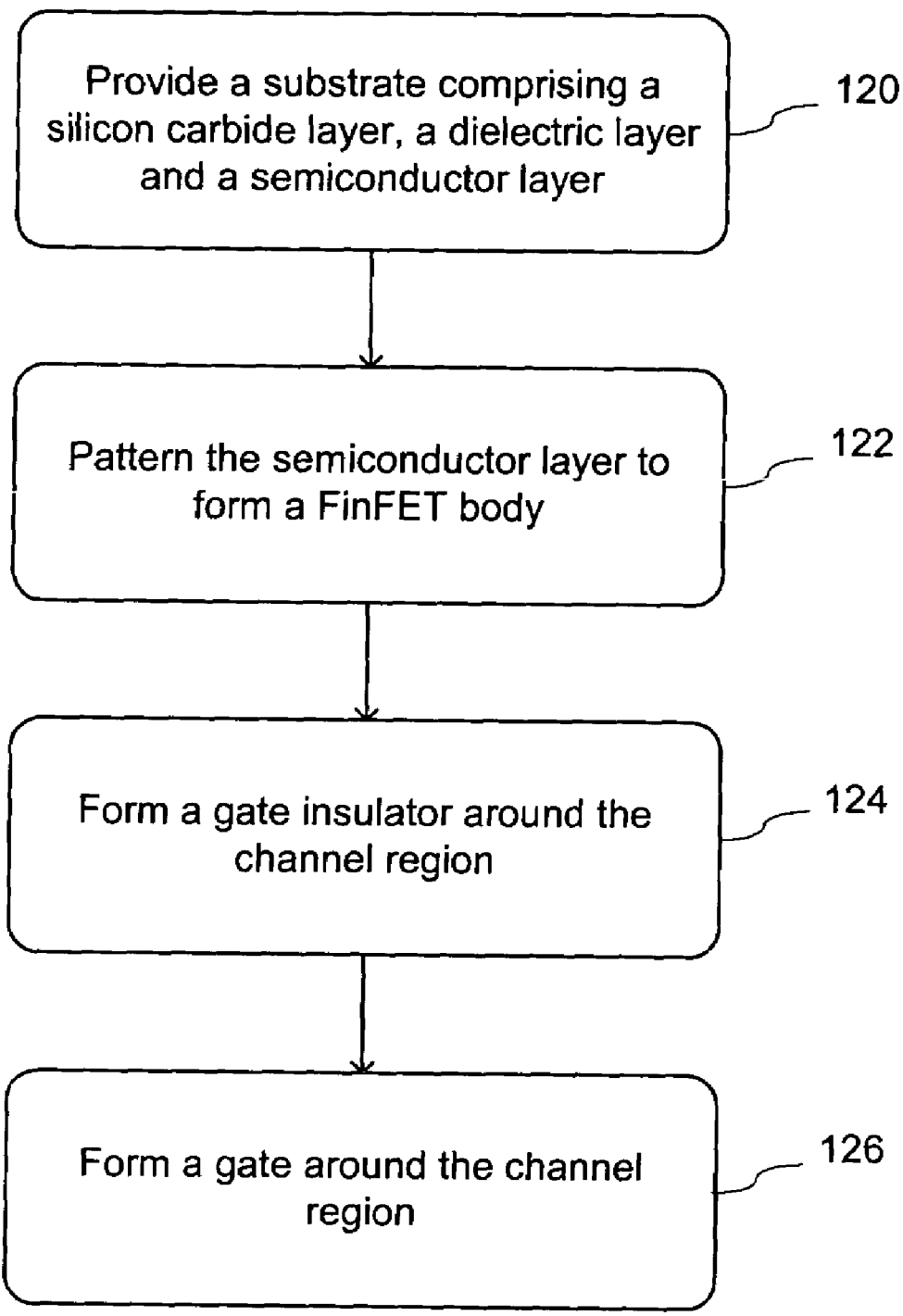
FIG. 9 shows a process flow for fabricating a first type of SOI device.

FIG. 9 shows a process flow encompassing an embodiment of the invention for forming an SOI device as shown in FIG. 6j and analogous devices. Initially an SOI substrate comprised of a silicon carbide layer having formed thereon a dielectric layer and having a layer of a semiconductor material formed on the dielectric layer is provided (120). A FinFET body is patterned from the semiconductor material (122), a gate insulator is formed around at least the channel region (124), and a gate is then formed around the channel region (126), the gate being separated from the channel region by the gate insulator. This process flow may be used to form a silicon SOI FinFET or a strained silicon SOI FinFET.

Figure 10:
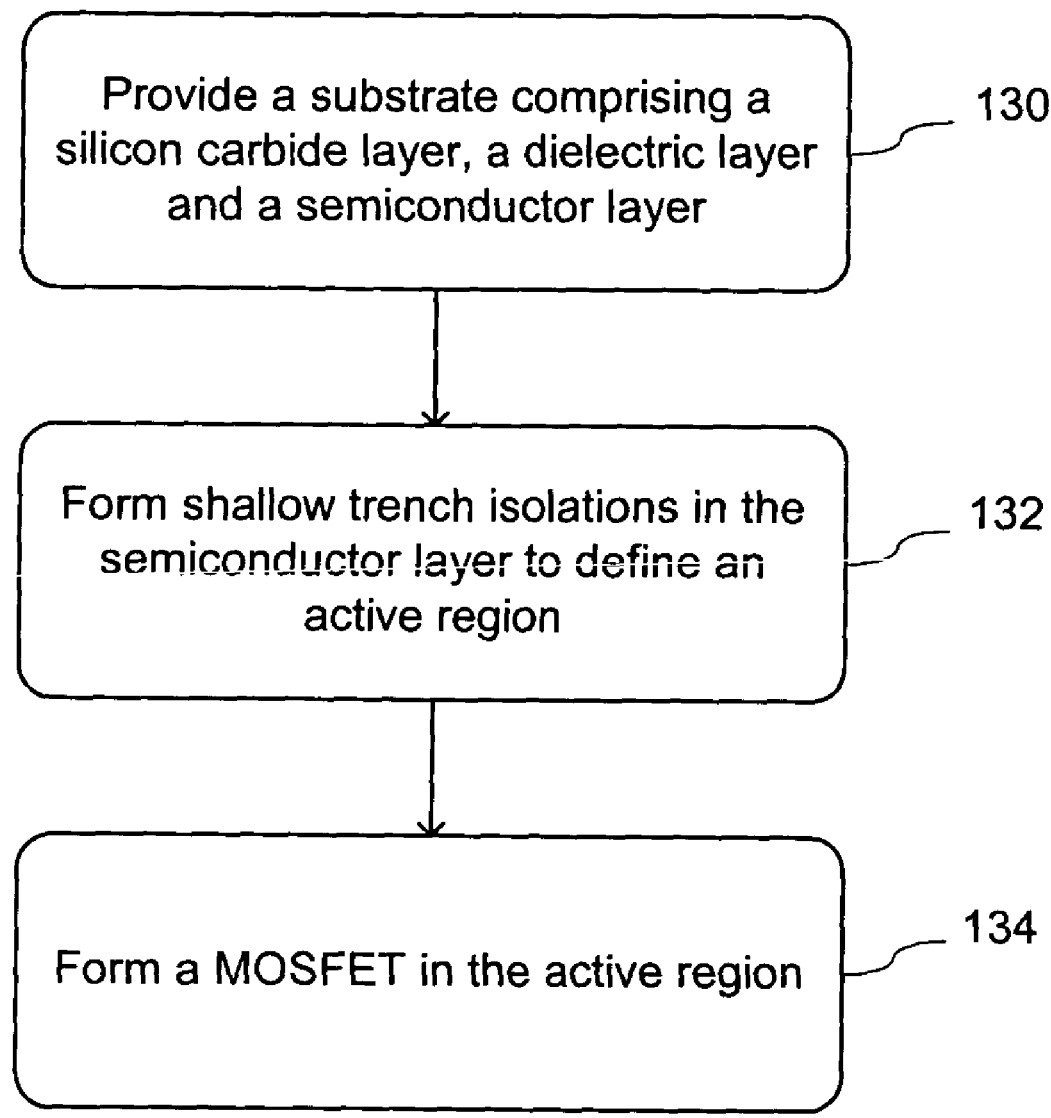
FIG. 10 shows a process flow for fabricating a second type of SOI device.

FIG. 10 shows a process flow encompassing an embodiment of the invention for forming an SOI device as shown in FIG. 7 and analogous devices. Initially an SOI substrate comprised of a silicon carbide layer having formed thereon a dielectric layer and having a layer of a semiconductor material formed on the dielectric layer is provided (130). Shallow trench isolations are formed to extend through the semiconductor material to the dielectric layer to define an active region of the substrate (132), and then a MOSFET is formed in the active region (134). This process flow may be used to form a silicon SOI MOSFET or a strained silicon SOI MOSFET.

It will be apparent to those having ordinary skill in the art that the tasks described in the above processes are not necessarily exclusive of other tasks, but rather that further tasks may be incorporated into the above processes in accordance with the particular structures to be formed. For example, intermediate processing tasks such as formation and removal of passivation layers or protective layers between processing tasks, formation and removal of photoresist masks and other masking layers, doping and counter-doping, cleaning, planarization, and other tasks, may be performed along with the tasks specifically described above. Further, the process need not be performed on an entire substrate such as an entire wafer, but rather may be performed selectively on sections of the substrate. Thus, while the embodiments illustrated in the figures and described above are presently preferred, it should be understood that these embodiments are offered by way of example only. The invention is not limited to a particular embodiment, but extends to various modifications, combinations, and permutations that fall within the scope of the claimed inventions and their equivalents.

What is claimed is:

1. A method of forming a silicon on insulator (SOI) device substrate, comprising:

forming a first dielectric layer on a first substrate;

forming a layer of silicon carbide over the first dielectric layer;

forming a second dielectric layer on a semiconductor layer of a second substrate;

placing the second dielectric layer in contact with the silicon carbide layer;

applying heat to bond the second dielectric layer to the silicon carbide layer and fracture the second semiconductor layer; and removing the second substrate and a portion of the semiconductor layer to yield a SOI device substrate comprised of a portion of the semiconductor layer, the second dielectric layer, the silicon carbide layer providing thermal dissipation of heat from the second semiconductor layer and the second dielectric layer, the first dielectric layer, and the first substrate.

2. The method claimed in claim 1, wherein the second dielectric layer is a silicon oxide layer.

3. The method claimed in claim 2, wherein the semiconductor layer is a silicon layer.

4. The method claimed in claim 2, wherein the semiconductor layer is a silicon germanium layer.

5. The method claimed in claim 4, wherein the silicon germanium layer has a composition $Si_{1-x}Ge_x$, where x is in the range of 0.1 to 0.3.

6. A method for forming a silicon on insulator (SOI) device, comprising:

providing an SOI substrate comprising a silicon carbide thermal dissipation layer, a dielectric layer formed on the silicon carbide layer, and a layer of a semiconductor material formed on the dielectric layer; forming an insulating layer on a silicon wafer; forming another layer of silicon carbide over the insulating layer; placing the dielectric layer in contact with the another silicon carbide layer; applying heat to bond the dielectric layer to the another silicon carbide layer;

patterning a FinFET body from the semiconductor material, the FinFET body comprising source and drain regions joined by a channel region;

forming a gate insulator around at least the channel region; and forming a gate around the channel region, the gate being separated from the channel region by the gate insulator, wherein the silicon carbide layer provides thermal dissipation for heat generated by the FinFET body.

7. The method claimed in claim 6, wherein the semiconductor material is silicon.

8. The method claimed in claim 6, wherein the semiconductor material is silicon germanium having a composition $Si_{1-x}Ge_x$, where x is in the range of 0.1 to 0.3.

9. The method claimed in claim 8, wherein a layer of strained silicon is grown on the FinFET body prior to forming the gate insulator.

10. The method claimed in claim 6, wherein the silicon carbide layer of the SOI substrate is formed on a silicon oxide layer of a silicon wafer.

11. A method for forming a silicon on insulator (SOI) device, comprising:

providing an SOI substrate comprising a silicon carbide thermal dissipation layer, a dielectric layer formed on the silicon carbide layer, and a layer of a semiconductor material formed on the dielectric layer; forming an insulating layer on a silicon wafer; forming another layer of silicon carbide over the insulating layer; placing the dielectric layer in contact with the another silicon carbide layer; applying heat to bond the dielectric layer to the another silicon carbide layer;

forming shallow trench isolations that extend through the semiconductor material to the dielectric layer and define an active region of the substrate; and forming a MOSFET in the active region, wherein the silicon carbide layer provides thermal dissipation for heat generated by the MOSFET.

12. The method claimed in claim 11, wherein the semiconductor material is silicon.

13. The method claimed in claim 11, wherein the semiconductor material is silicon germanium having a composition $Si_{1-x}Ge_x$, where x is in the range of 0.1 to 0.3.

14. The method claimed in claim 13, further comprising growing strained silicon on silicon germanium in the active region.

15. The method claimed in claim 11, wherein the silicon carbide layer of the SOI substrate is formed on a silicon oxide layer of a silicon wafer.

* * * * *